(12) United States Patent
Liu et al.

(10) Patent No.: US 7,636,003 B2
(45) Date of Patent: Dec. 22, 2009

(54) LIMITING AMPLIFIERS

(75) Inventors: Shen-luan Liu, Taipei (TW);
Chih-Hung Lee, Chiayi Hsien (TW)

(73) Assignees: Mediatek Inc., Hsin-Chu (TW);
National Taiwan University, Taipei (TW)

( * ) Notice: Subject to any disclaimer, the term of this patent is extended or adjusted under 35 U.S.C. 154(b) by 0 days.

(21) Appl. No.: 11/688,265

(22) Filed: Mar. 20, 2007

(65) Prior Publication Data
US 2008/0030266 A1 Feb. 7, 2008

Related U.S. Application Data

(63) Continuation of application No. 60/807,944, filed on Jul. 21, 2006.

(51) Int. Cl.
*H03L 5/00* (2006.01)
*H03F 3/45* (2006.01)

(52) U.S. Cl. .......................... 327/307; 330/9; 330/259

(58) Field of Classification Search ......... 327/306–307, 327/560–563; 330/252–254, 9
See application file for complete search history.

(56) References Cited

U.S. PATENT DOCUMENTS

| | | | | |
|---|---|---|---|---|
| 5,264,805 | A * | 11/1993 | Yokozaki | 330/107 |
| 6,784,749 | B1 * | 8/2004 | Cove | 330/308 |
| 6,903,605 | B2 * | 6/2005 | Cove | 330/9 |
| 6,914,479 | B1 * | 7/2005 | Gabillard et al. | 330/69 |
| 7,015,750 | B2 * | 3/2006 | Gupta | 330/9 |
| 7,265,620 | B2 * | 9/2007 | Liu et al. | 330/253 |

OTHER PUBLICATIONS

"25GHz Static Frequency Divider and 25Gb/s Multiplexer in 0.12μm CMOC" Knapp et al., ISSCC 2002, Session 17, Advanced RF Techniques, 17.9, pp. 467-469.
"96-GHz Static Frequency Divider in SiGe Bipolar Technology" Rylyakov et al., IEEE Oct. 2004, pp. 1712-1715.
"A 32GHz Quadrature LC-VCO in 0.25μm SiGe BiCMOS Technology" Chan et al., ISSCC 2005, Session 29, RF Techniques, 29.5, pp. 538-539, 616.
"A 40-Gb/s Clock and Data Recovery Circuit in 0.18-μm CMOS Technology" Lee et al., IEEE Dec. 2003, pp. 2181-2190.

(Continued)

*Primary Examiner*—Dinh T. Le
(74) *Attorney, Agent, or Firm*—Thomas, Kayden, Horstemeyer & Risley

(57) ABSTRACT

A limiting amplifier with an input stage with dc offset cancellation, identical gain stages, an output buffer and a feedback filter. The input stage receives a differential input signal and outputs a first intermediate differential signal. The gain stages are cascaded to amplify the first intermediate differential signal and generate a second intermediate differential signal, amplified by the output buffer to produce an output signal. The feedback filter provides a dc offset voltage of the output signal to the input stage for the dc offset cancellation. The input stage comprises a resistor network coupled between a pair of input nodes and a power line and comprising a common resistor, a pair of load resistors and a shunt resistor. The load resistors share a common terminal connected to the common resistor that is connected to the power line. The shunt resistor has two terminals respectively connected to the load resistors.

4 Claims, 10 Drawing Sheets

OTHER PUBLICATIONS

"A Fully Integrated 24-GHz Eight-Element Phased-Array Receiver in Silicon" Guan et al., IEEE Dec. 2004, pp. 2311-2320.

"Capacitively Averaged Multi-Phase LC Oscillators" Park et al., IEEE 2005, pp. 2651-2654.

"A 1.2V 37-38.5GHz 8-phase Clock Generator in 0.13μm CMOS Technology" Lee et al., IEEE 2006.

"Design and Analysis of a 20-GHz Clock Multiplication Unit in 0.18-μm CMOS Technology" Lee et al., 2005, pp. 140-143.

"10-Gb/s Limiting Amplifier and Laser/Modulator Driver in 0.18-μm CMOS Technology" Galal et al., IEEE Dec. 2003, pp. 2138-2146.

"40-Gb/s Amplifier and ESD Protection Circuit in 0.18-μm CMOS Technology" Galal et al., IEEE Dec. 2004, pp. 2389-2396.

"6-kΩ 43-Gb/s Differential Transimpedance-Limiting Amplifier with Auto-Zero Feedback and High Dynamic Range" Tran et al., IEEE Oct. 2004, pp. 1680-1689.

"A 0.1-25.5-GHz Differential Cascaded-Distributed Amplifier in 0.18-μm CMOS Technology" Lee et al., 2006.

"A Fully Integrated 43.2Gb/s Clock and Data Recovery and 1:4 DEMUX IC in InP HBT Technology" Yen et al., ISSCC 2003, Session 13, 40Gb/s COmmunication ICS, Paper 13.6.

"Analysis of the Performance of Four-Cascaded Single-Stage Distributed Amplifiers" Banyamin et al., IEEE Dec. 2000, pp. 2657-2663.

"A 35-Gb/s Limiting Amplifier in 0.13μm CMOS Technology" Lee et al., IEEE 2006.

"InP D-HBT ICs for 40-Gb/s and Higher Bitrate Lightwave Transceivers" Baeyens et al., IEEE Sep. 2002, pp. 1152-1159.

\* cited by examiner

LIMITING AMPLIFIERS

CROSS-REFERENCE TO RELATED APPLICATION

This application is related to and claims priority under 35 U.S.C. §119(e) to U.S. Provisional Patent Application Ser. No. 60/807,944, filed Sep. 18, 2006, entitled "A Limiting Amplifier For Optical Communication", the contents of which are hereby incorporated by reference in their entirety.

BACKGROUND OF THE INVENTION

1. Field of the Invention

The invention generally relates to limiting amplifiers and in particular to limiting amplifiers for optical communication.

2. Description of the Related Art

High speed limiting amplifiers (LA) play a critical role in various wireline communications, amplifying a weak signal to deliver a large output swing for succeeding data recovery circuit. FIG. 1 shows a conventional wireline communication system, where laser 12, driven by driver/modulator 14 outputs an optical signal to a receiver through optical fiber 15. Photo diode 16 detects the optical signal to generate a weak current signal, which is then transformed by transimpedance amplifier (TIA) 18 to a voltage signal, usually with a swing of only several or tens of mV. The weakness of the voltage signal from TIA 18 necessitates limiting amplifier 20 to amplify the voltage signal such that a signal with a fall swing can be provided to clock and data recovery circuit (CDR) 22 to achieve high speed digital data processes. Limiting amplifier 20 may precede or follow an optional equalizer (not shown).

Conventional Cherry-Hopper amplifiers have been employed in limiting amplifiers to achieve a data rate of 40 Gb/s in hetrojunction bipolar technology, but the power dissipation is prohibitive. Possible solutions in CMOS technology are to use a wideband amplifier with inductive peaking and a distributed amplifier (DA) or a cascaded distributed amplifier (CDA). The bandwidth of a DA is good, but the gain is low. It is desired to have a limiting amplifier with low power consumption, a high gain and greater bandwidth.

BRIEF SUMMARY OF THE INVENTION

An embodiment of the invention provides a limiting amplifier with an input stage, gain stages, an output buffer and a feedback filter. The input stage is capable of dc offset cancellation, receiving a differential input signal and outputting a first intermediate differential signal. All the gain stages are identical, cascaded to amplify the first intermediate differential signal and generate a second intermediate differential signal. The output buffer amplifies the second intermediate differential signal to produce an output signal. The feedback filter provides a dc offset voltage of the output signal to the input stage for the dc offset cancellation.

The input stage in an embodiment comprises a resistor network coupled between a pair of input nodes and a power line. The resistor network comprises a common resistor, a pair of load resistors and a shunt resistor. The common resistor is connected to the power line. The load resistors share a common terminal connected to the common resistor. The shunt resistor has two terminals respectively connected to the load resistors.

In an embodiment, each gain stage comprises a pair of LC-ladder low pass filters. Each LC-ladder low pass filter comprises a first LC network coupled to receive an amplified signal and a second LC network connected in series to the first LC network. A node connecting the first and second networks of a preceding LC-ladder low pass filter outputs signals to a subsequent LC-ladder low pass filter.

The output buffer in an embodiment comprises a differential amplifier, a ft-doubler, and a negative feedback architecture. The differential amplifier acts as an input of the output buffer. The ft-doubler is cascaded with the differential amplifier. The negative feedback architecture is connected between an output and an input of the ft-doubler.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
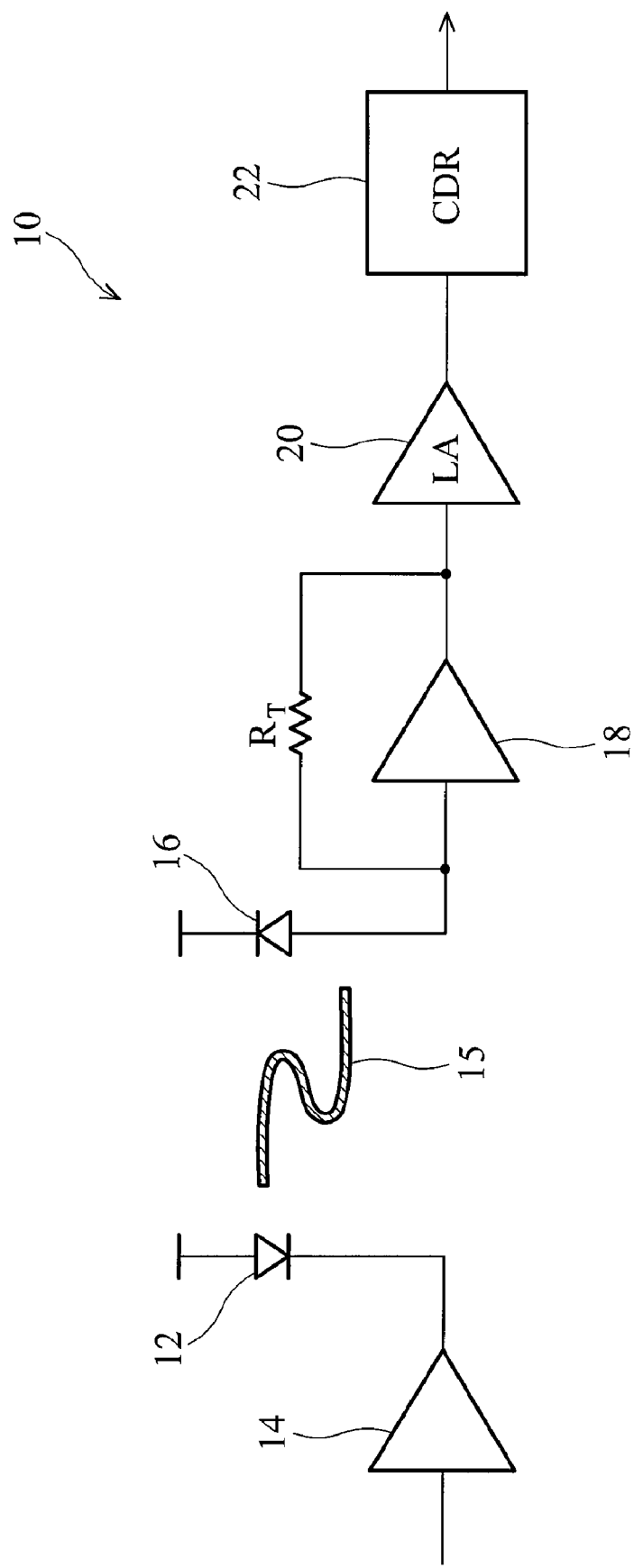
FIG. 1 shows a conventional wireline communication system.
Figure 2:
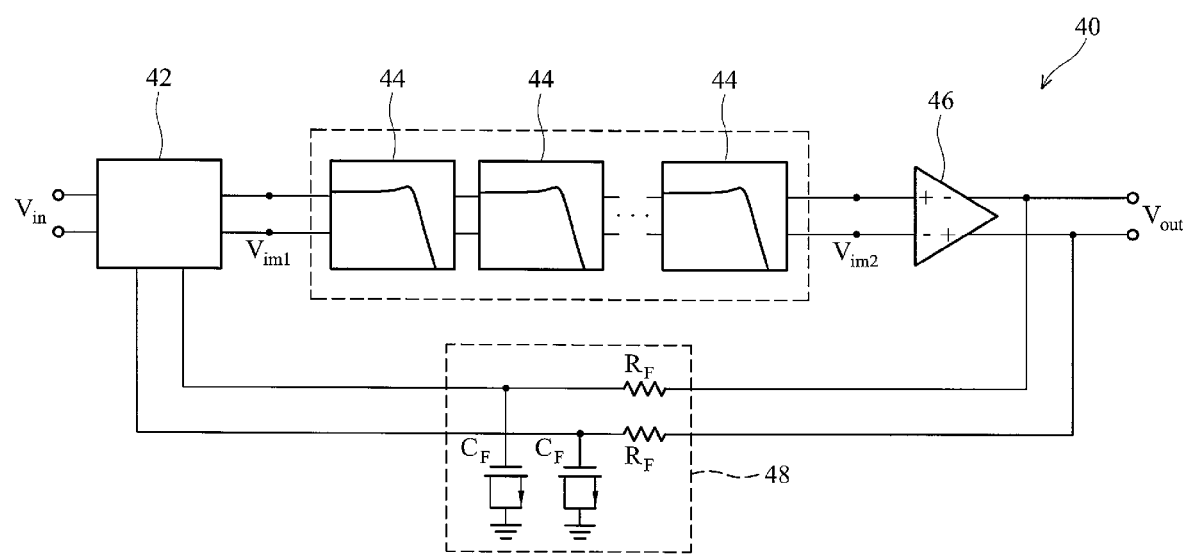
FIG. 2 shows a limiting amplifier according to an embodiment of the invention.

Characteristics of a limiting amplifier include: input sensitivity, gain, bandwidth, noise margin, dc offset voltage, and output voltage swing. A high speed limiting amplifier using cascaded distributed amplifier technology is provided. FIG. 2 shows a limiting amplifier 40 according to an embodiment of the invention, including an input stage 42 with dc offset cancellation, gain stages 44, output buffer 46 and feedback filter 48. Input stage 42 receives differential signal $V_{in}$ and outputs intermediate differential signal $V_{im1}$. Gain stages 44 are all identical, cascaded to amplify intermediate differential signal $V_{im1}$ and generate intermediate differential signal $V_{im2}$. Output buffer 46 amplifies intermediate differential signal $V_{im2}$ to produce output signal $V_{out}$. Feedback filter 48 provides a dc offset voltage of the output signal $V_{out}$ to input stage 42 for dc offset cancellation. The cascade number of gain stages 44 satisfies sufficient gain, bandwidth, and low input-referred noise.

According to an embodiment of the invention, five gain stages 44 using cascaded-distributed amplifiers are employed to optimize amplification. A low pass path with resistors $R_F$ and capacitors $C_F$ is used in feedback filter 48 to detect dc offset voltage at the output port while corresponding offset voltage removal is employed in input stage 42 to stabilize limiting amplifier 40. Each gain stage 44 utilizes a cascaded-distributed amplifier, configured with a Butterworth filter structure to extend bandwidth. Output buffer 46 uses an improved Cherry-Hooper amplifier, providing high speed data transmission.

Limiting amplifier 40, the embodiment in FIG. 2, is detailed as follows

Input Stage and Feedback Filter

Figure 3:
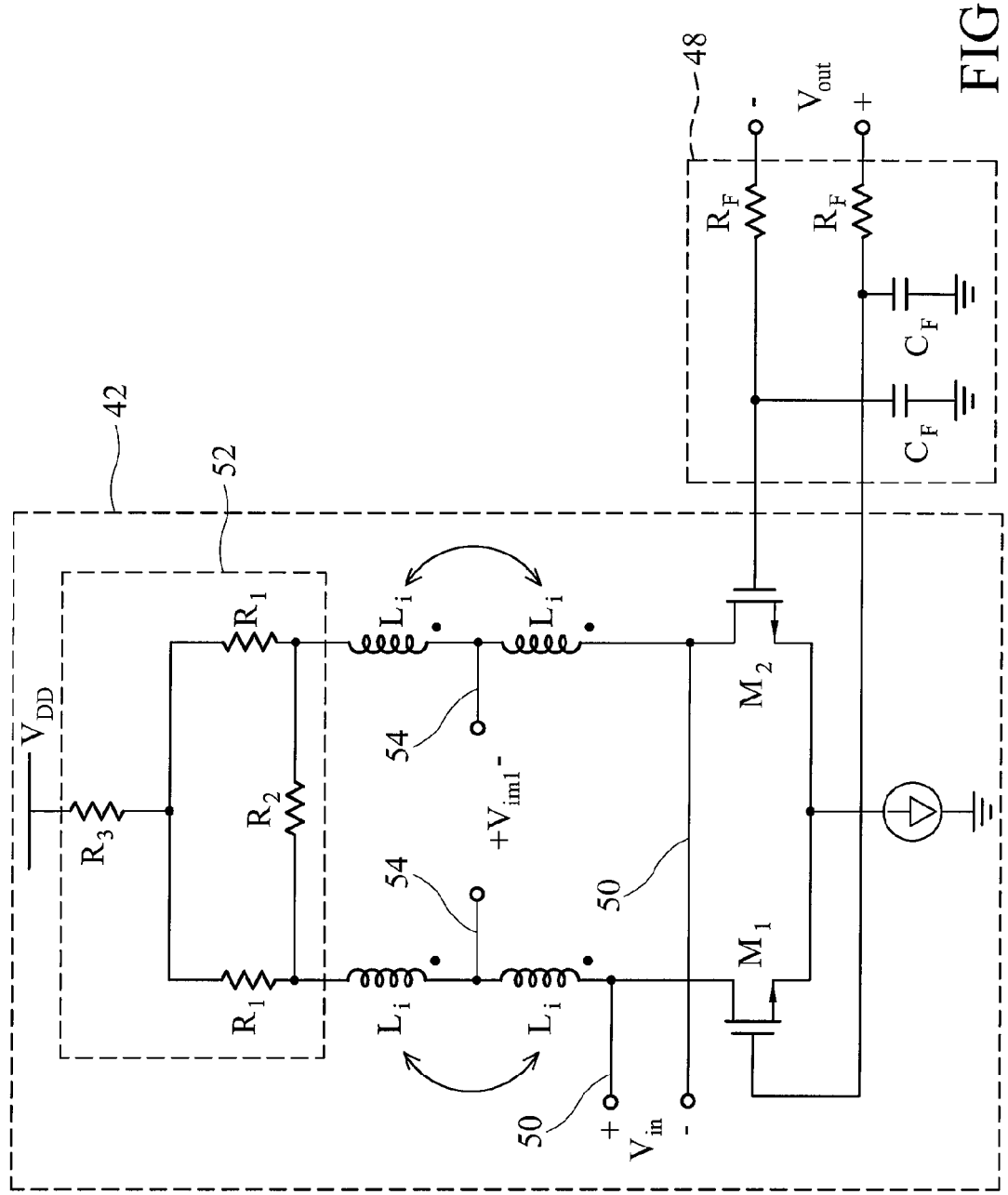
FIG. 3 exemplifies both the input stage and the feedback filter in FIG. 2.

FIG. 3 exemplifies both input stage 42 and feedback filter 48. Using the low pass filters, each consisting of a resistor $R_F$ and a capacitor $C_F$, the differential pair $M_{1-2}$ senses the dc offset voltage of the limiting amplifier output signal $V_{out}$. The input matching network comprises on-chip transformers $L_i$ and resistor network $R_1$-$R_2$-$R_3$ 52.

Each transformer $L_i$, connected between a corresponding input node 50 and a corresponding resistor $R_1$, is a center-tapped transformer providing a center tap 54 for outputting intermediate differential signal $V_{im1}$. Each transformer $L_i$ has a symmetric geometry as a T-coil network to extend bandwidth.

Resistor network 52, coupled between power line $V_{DD}$ and input nodes 50, must satisfy the tradeoff between the 50-Ω broadband matching and input dc bias. Resistor $R_3$, as a common resistor, is used to adjust DC bias. Resistors $R_1$ are load resistors sharing a common terminal connected to resistor $R_3$ while resistor $R_2$, as a shunt resistor, has two terminals respectively connected to resistors $R_1$. $R_1$ and $R_2$ are placed in parallel to robustly match 50-Ω source termination and relax the resistor variations. Adding resistor $R_3$ in the input matching network lowers required resistance values of resistors $R_1$ and $R_2$ to reduce parasitic capacitance and enhance bandwidth.

The design of dc offset cancellation on input stage 42 focuses on the feedback gain of the feedback network. As low pass filters consisting of resistors $R_F$ and capacitors $C_F$ are added, the overall limiting amplifier 40 resultantly exhibits a high pass frequency response. With respect to a high-gain amplifier, the feedback gain for a low frequency band must be less than 1, to avoid oscillation resulting from the accumulation and amplification of noise through the feedback network.

Gain Stages

To provide both a broadband bandwidth and a high gain and overcome the limitations of transistor cutoff frequency, several broadband technologies are combined, including Butterworth network load, cascaded-distributed amplifiers, and active feedback. The implementation and features of each technology and resulting gain stages 44 are as follows.

Figure 4:
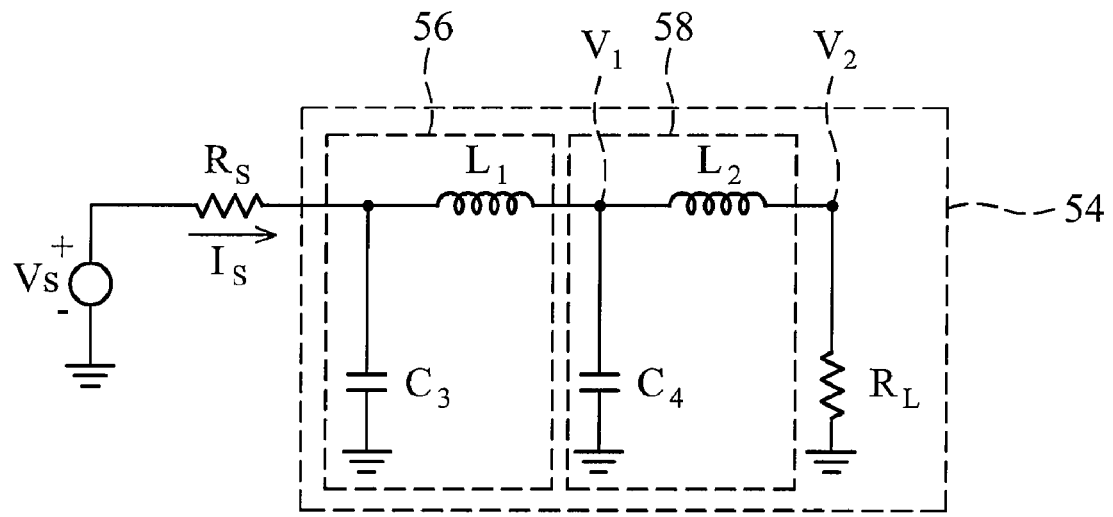
FIG. 4 shows a 4th-order LC-ladder Butterworth low pass filter.

Conventional broadband amplifiers employ inductive peaking to extend 80% more bandwidth to increase data transmission. To further extend the bandwidth, Butterworth filters are applied to a broadband amplifier. FIG. 4 shows a 4th-order LC-ladder Butterworth low pass filter 54, using two inductors $L_1$ and $L_2$, and two capacitors $C_3$ and $C_4$ and providing a $4^{th}$-order transfer function of:

$$\left| \frac{V_2}{V_S}(s = j\omega) \right| = \frac{K}{\sqrt{1 + \varepsilon^2 \left(\frac{\omega}{\omega_C}\right)^{2N}}} \quad (1)$$

Figure 5:
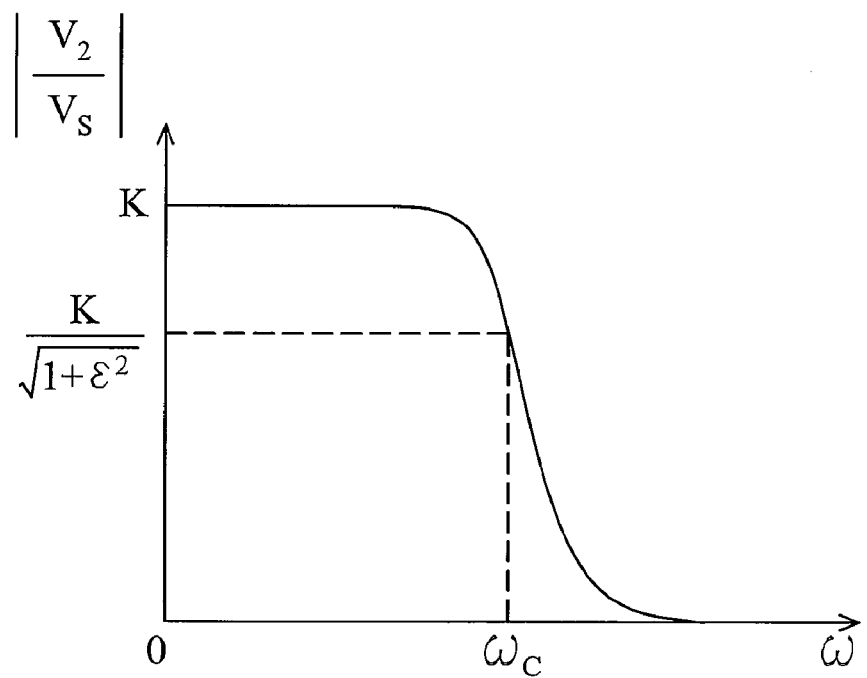
FIG. 5 shows a plot of a transfer function for a 4th-order LC-ladder Butterworth low pass filter.
Figure 6:
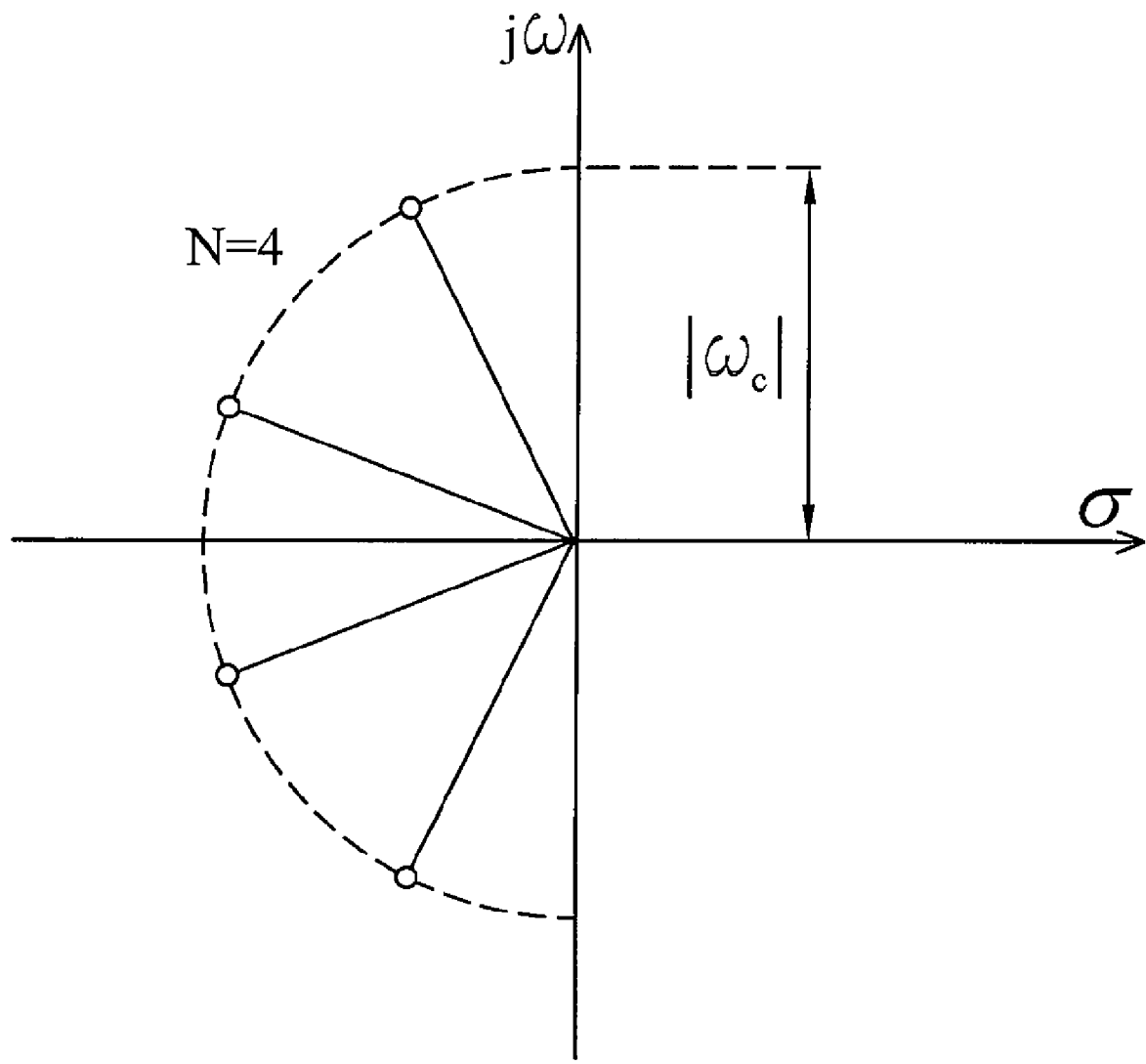
FIG. 6 shows the locations of the poles of a 4th-order LC-ladder Butterworth low pass filter.

Poles of the transfer function are located at $$s = \varepsilon^{-\frac{1}{N}} \cdot \exp\left(j \frac{2M + N - 1}{2N} \pi\right) \text{ for } M = 1, 2, \ldots, N, \quad (2)$$

wherein $K = R_L/(R_L + R_S)$, N is 4, the order of the filter, and $\omega_C$ and $\varepsilon$ are the cutoff frequency and the decay factor, respectively. The plot of the transfer function is shown in FIG. 5, clearly having maximal flatness and linear phase response in the passband below $\omega_C$. FIG. 6 shows the locations of the poles of a 4th-order LC-ladder Butterworth low pass filter. The four poles lie on a circuit of unit radius, $\omega_C$, in the left hand plane with equal distance apart. $\omega_C$ is the oscillating frequency of $L_1$-$C_3$-$C_4$ network. To generate Butterworth frequency response, normalized values of the components, i.e. inductor, capacitor, and resistor, are shown in the following table 1.

TABLE 1

| N = 4 Butterworth Filter | |
|---|---|
| Parameter | Normalized values for $\omega_c = 1$ |
| $L_1$ | 1.848 |
| $L_2$ | 0.7654 |
| $C_3$ | 0.7654 |
| $C_4$ | 1.848 |
| $R_L$ | 1 |
| $R_S$ | 1 |

Figure 7:
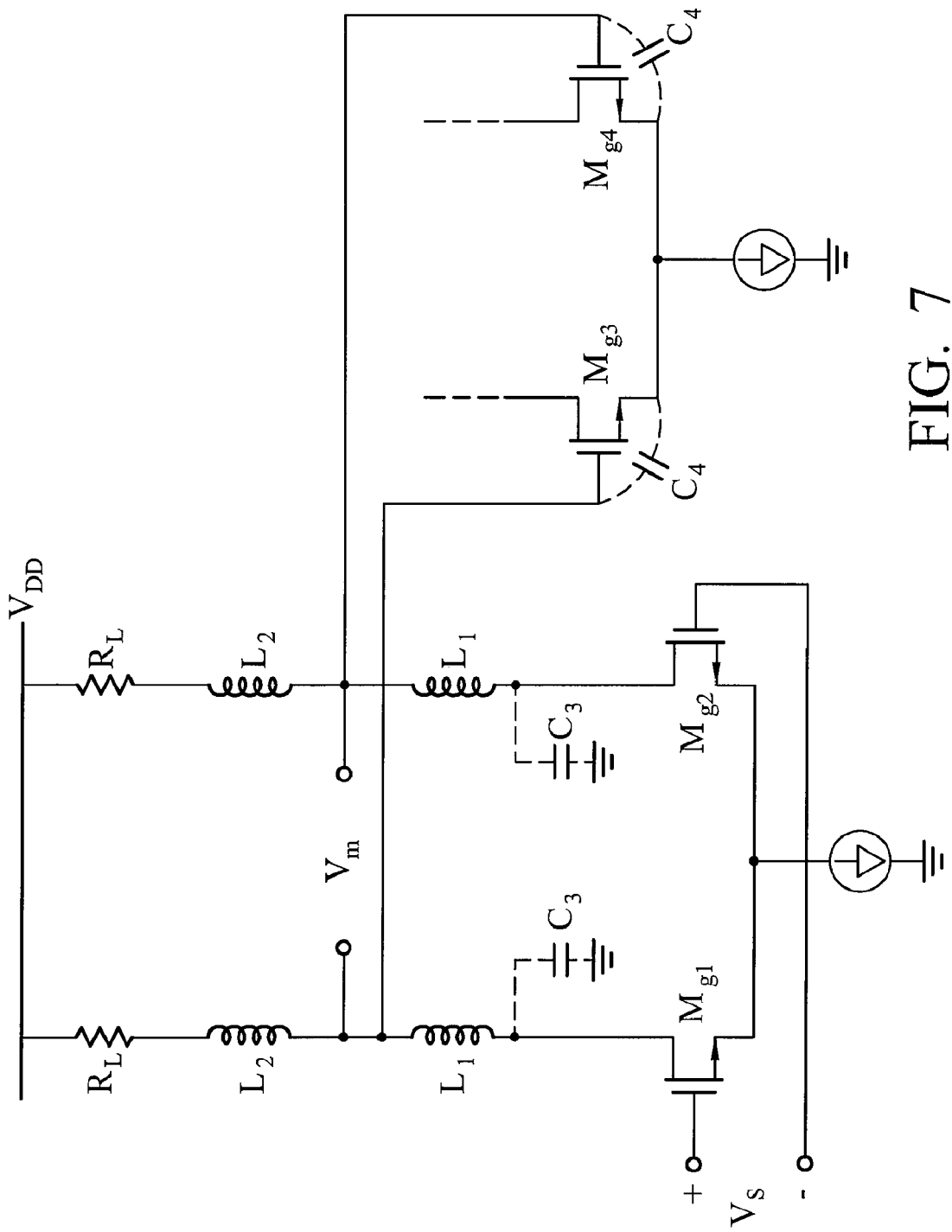
FIG. 7 illustrates a pair of cascaded-distributed amplifiers.
Figure 8:
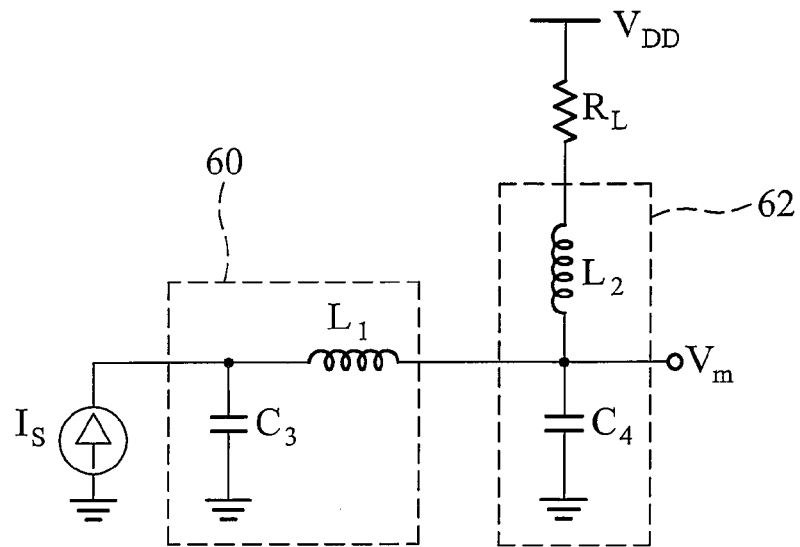
FIG. 8 shows a small signal model of one cascaded amplifier in FIG. 7.

FIG. 7 illustrates a pair of cascaded-distributed amplifiers, each using a LC-ladder network as a load, and designates a serial output port at nodes $V_m$. Capacitor $C_3$ is the drain-to-bulk capacitor parasitizing on MOS $M_{g1}$ or $M_{g2}$ and capacitor $C_4$ is the gate-to-source capacitor parasitizing MOS $M_{g3}$ or $M_{g4}$. Inductance increment of inductor $L_2$ is expected to introduce more gain to compensate the capacitance loss through the signal path. FIG. 8 shows a small signal model of one cascaded amplifier in FIG. 7. LC network 60, comprising capacitor $C_3$ and inductor $L_1$, is coupled to controllable current source $I_S$, which also represents an amplified signal from MOS $M_{g1}/M_{g2}$. LC network 62, comprising capacitor $C_4$ and inductor $L_2$, is connected in series to LC network 60. Node $V_m$, connecting LC networks 60 and 62, outputs signals to a subsequent cascaded-distributed amplifier comprising another LC-ladder low pass filter. An output impedance frequency response of the small signal model in FIG. 8 can be expressed in the function:

$$\frac{V_1}{I_s}(s) = \frac{sL_2 + R_L}{s^4 L_1 L_2 C_3 C_4 + s^3 R_L L_1 C_3 C_4 + s^2 (L_1 C_3 + L_2 C_4 + C_3 C_4) + s R_L (C_3 + C_4) + 1} \quad (3)$$

In order to approach a Butterworth response, $R_L$ is set as $$R_L = \sqrt{\frac{L_1}{(C_3 + C_4)/2}} \quad (4)$$

As the $C_{GD}$ of transistor $M_{g3}$ or $M_{g4}$ contributes Miller multiplication effect, $C_4$ exceeds $C_3$. At the frequency of $\omega_C$, a gain peak will occur, as expressed below:

$$\left|\frac{V_2}{I_S}(s = j\omega_C)\right| = \frac{C_4}{C_3} \times \sqrt{R_L^2 + \omega_C^2 L_2^2} \quad (5)$$

Figure 9:
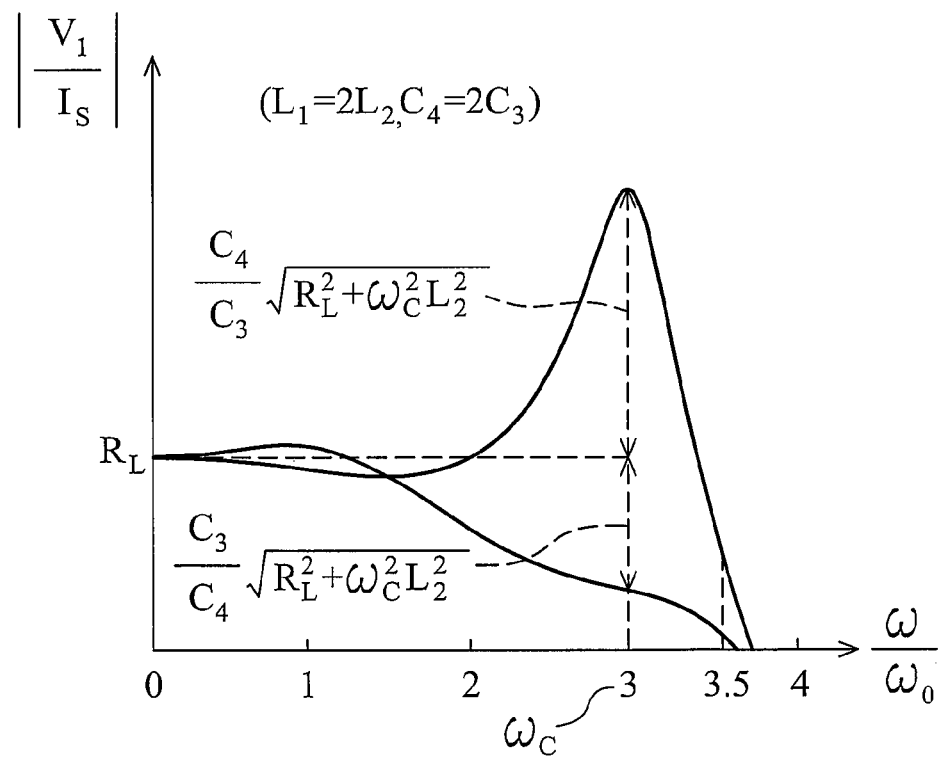
FIG. 9 shows an output impedance frequency response of the small signal model in FIG. 8.

For example, if $C_4 = 2*C_3$ and $L_1 = 2*L_2$, then an output impedance frequency response as shown in FIG. 9 can be obtained, showing an extended 3 db bandwidth to a factor about 3.8, where $\omega_C$ is the oscillating frequency of $L_1$-$C_3$-$C_4$ network. Shunt and series peaking, in the contrary, causes at $\omega_C$ a gain loss of:

$$\left|\frac{V_1}{I_S}(s = j\omega_C)\right| = \frac{C_3}{C_4} \times \sqrt{R_L^2 + \omega_C^2 L_2^2}, \quad (6)$$

and seriously narrows the bandwidth extension to only a factor of about 2.3.

Figure 10:
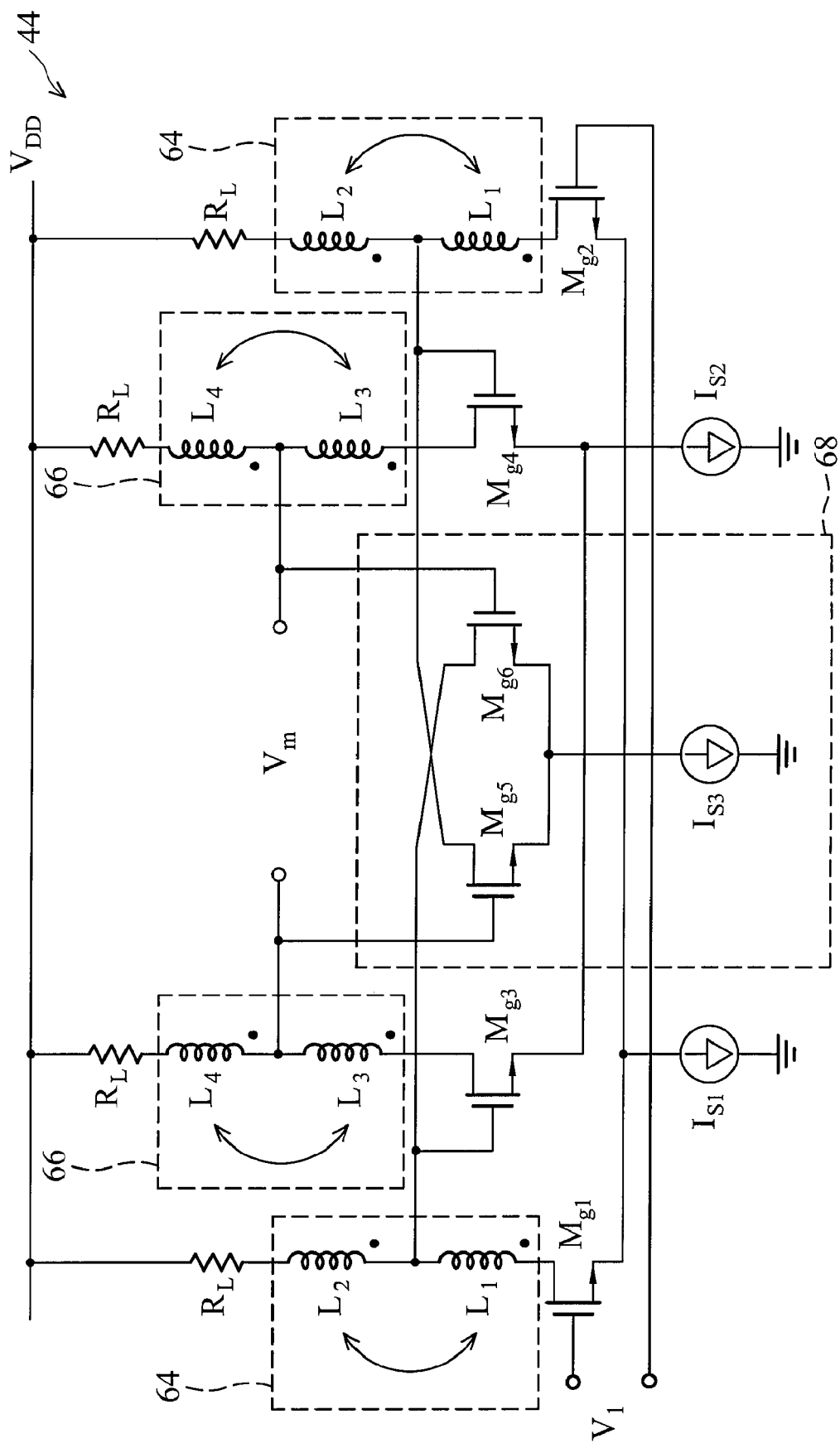
FIG. 10 details the circuit schematic of a single gain stage.

Finally, a single gain stage 44 according to an embodiment of the invention combines cascaded-distributed amplifiers, a Butterworth network, active feedback and on-chip transformers. FIG. 10 details the circuit schematic of a single gain stage 44, including two differential amplifiers together with active feedback.

Constant current source $I_{S1}$ provides dc bias for a first differential amplifier comprising a pair of MOSs ($M_{g1}$ and $M_{g2}$) and a pair of LC-ladder low pass filters (each including inductors $L_1$ and $L_2$ and resistor $R_L$). Similarly, constant current source $I_{S2}$ provides dc bias for a second differential amplifier comprising a pair of MOSs ($M_{g3}$ and $M_{g4}$) and a pair of LC-ladder low pass filters (each including inductors $L_3$ and $L_4$ and resistor $R_L$). The second differential amplifier is cascaded (subsequent) to the first one. Although no capacitors are shown in FIG. 10, MOSs ($M_{g1}$-$M_{g6}$ and MOSs in a subsequent gain stage) contribute parasitic capacitors, such as gate-to-source and drain-to-bulk capacitors, for required components in the LC-ladder low pass filters. For example, the drain-to-bulk capacitor of $M_{g1}$ in the first differential amplifier and the gate-to-source capacitor of $M_{g3}$ in the second differential amplifier are two capacitors belonging to one LC-ladder low pass filter. Furthermore, rather than transmission lines, the asymmetric 1:2 on-chip transformers 64 and 66 (i.e., $L_1 = 2*L_2$, $L_3 = 2*L_4$) are used to reduce the long-line loss and facilitate the differential routing. To accurately predict the transformer, EM simulator has been used to obtain an accurate model.

An active feedback architecture 68 comprising MOSs $M_{g5}$ and $M_{g6}$ and current source $I_{S3}$ negatively feeds the output signal from nodes $V_M$ of the second differential amplifier to the inputs of the second differential amplifier (the gates of MOSs $M_{g3}$ and $M_{g4}$). Beneficially, the active feedback architecture 68 does not resistively load the second differential amplifier and improves the gain-bandwidth product of one gain stage 44.

Based on simulation, the proposed architecture provides a gain of 8 db and a bandwidth of 35 GHz. The gain-bandwidth product is improved by a factor of 3.8. Meanwhile, utilizing on-chip asymmetric transformers conserves about 50% of the area required by conventional independent inductors, enabling compact layout.

Output Buffer

Figure 11:
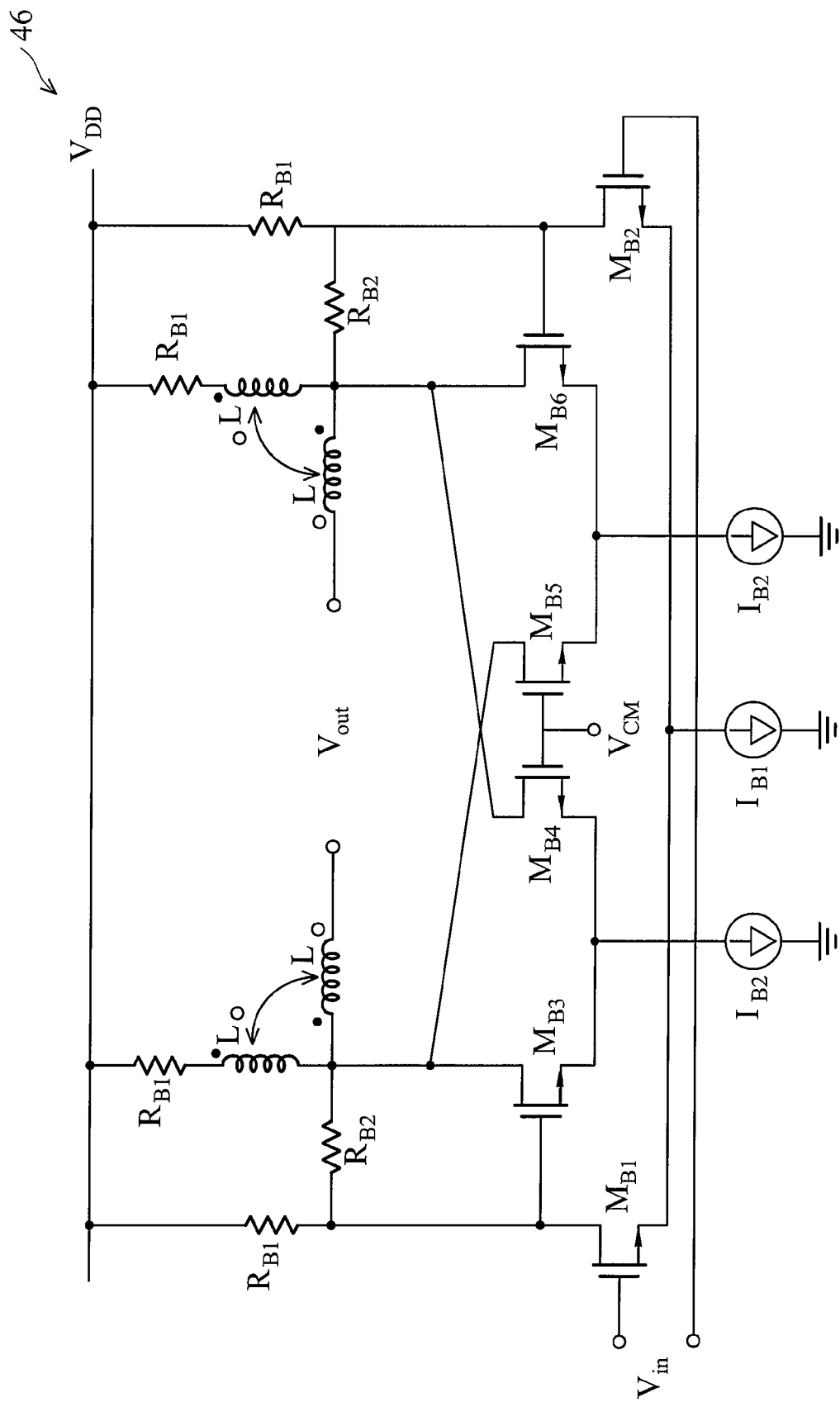
FIG. 11 exemplifies the output buffer in FIG. 2.

FIG. 11 exemplifies output buffer 46 in FIG. 2, showing the combination of a Cherry-Hooper amplifier and a ft-doubler. As known in the art, a Cherry-Hooper amplifier is a differential amplifier with two stages in series and a negative feedback architecture connected between the outputs and the inputs of the rare stage. FIG. 11 shows a front stage of a differential amplifier comprising MOSs $M_{B1}$ and $M_{B2}$, and resistors $R_{B1}$. The gates of $M_{B1}$ and $MB_2$ in the front stage are coupled to receive intermediate differential signal $V_{im2}$ from one final gain stage 44. The rare stage is a ft-doubler comprising MOSs $M_{B3}$, $M_{B4}$, $M_{B5}$ and $M_{B6}$, resistors $R_{B2}$, and symmetric on-chip transformers $L_0$. The inputs of the ft-doubler are the gates of $M_{B3}$ and $M_{B6}$, and the outputs the drains of $M_{B3}$ and $M_{B6}$. Negative feedback architecture has two resistors $R_{B2}$, each connected between one input and one output of the ft-doubler. Each symmetric on-chip transformer $L_0$ has a center tap connected to one resistor $R_{B2}$ while one end of the transformer $L_0$ is connected to resistive load $R_{B2}$ and the other produces output signal $V_{out}$.

Output buffer 46 in FIG. 11 offers at least the following several advantages. Using the Cherry-Hooper amplifier in the front of a ft-doubler lowers the capacitance load for the gain stage. Since the ft-doubler uses large input transistors, its large input capacitance is alleviated by the resistive feedback loop of the Cheery-Hooper amplifier and the time constant at the internal nodes is also reduced. Since the 1:1 transformer is used to absorb the parasitic capacitance, the output −3 db bandwidth is extended. The single-ended and differential output swings of 300 m $V_{pp}$ and 600 m $V_{pp}$ are provided.

Figure 12:
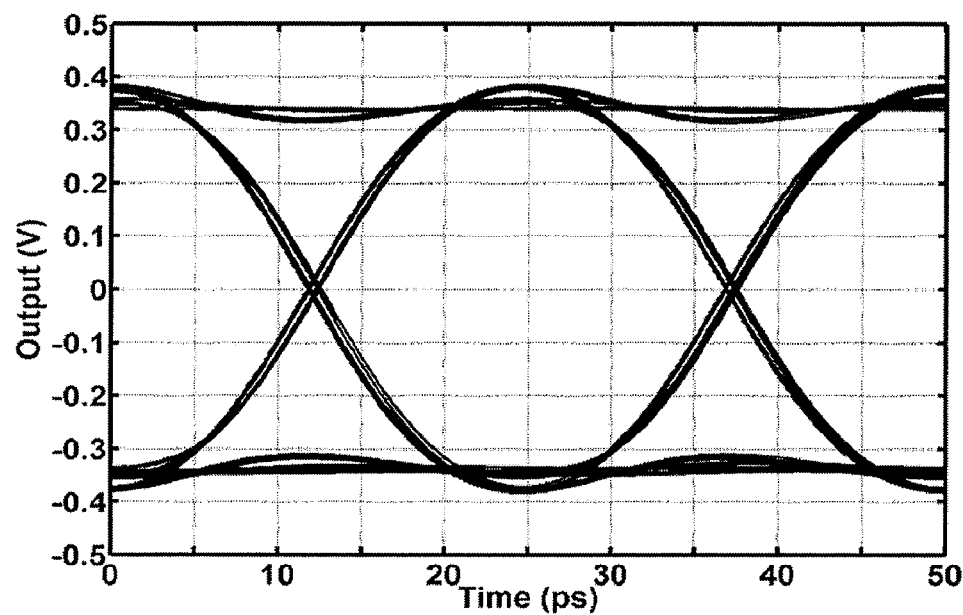
FIG. 12 shows a simulated output result of the output buffer in FIG. 11.

FIG. 12 shows a simulated output result of output buffer 46 in FIG. 11, indicating an operating rate of 40 Gb/s, 0.8 ps of peak-to-peak jitter, and a differential output swing of 600 m $V_{pp}$.

Experimental Result

Figure 13:
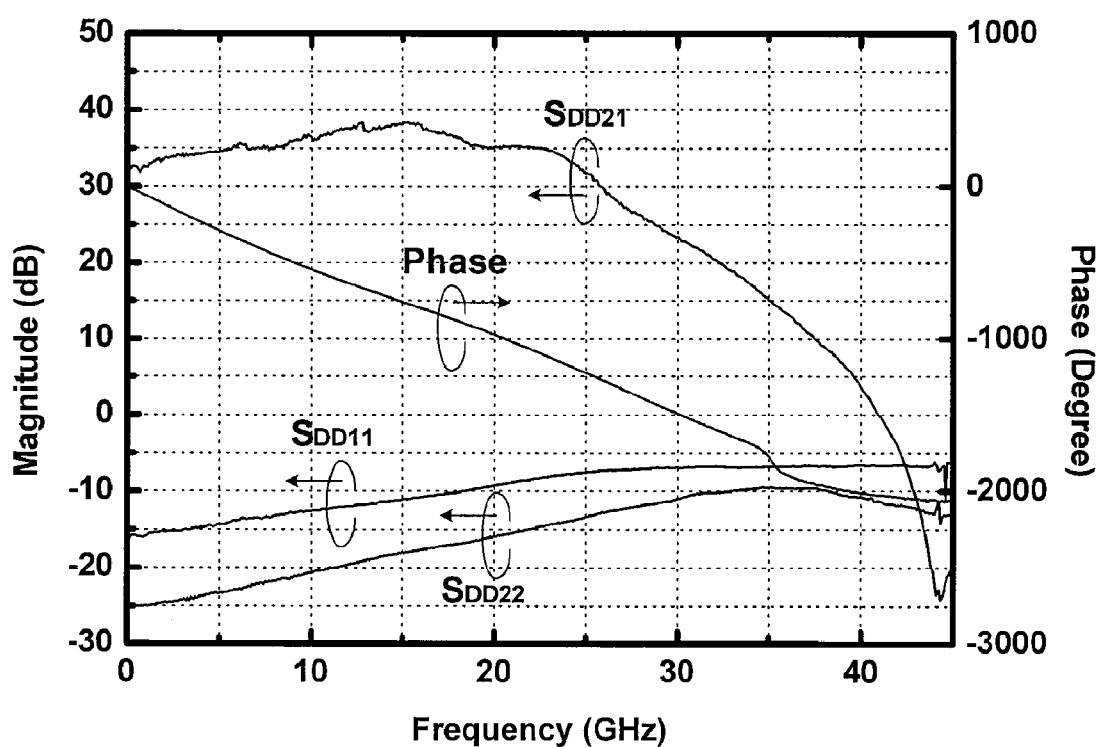
FIG. 13 plots the measured frequency response of a fabricated limiting amplifier according to an embodiment of the invention.

A limiting amplifier according to an embodiment of the invention was fabricated in a 0.13 um CMOS technology. FIG. 13 plots the measured frequency response of one fabricated limiting amplifier, indicating a passband bandwidth of 26.2 GHz and a differential gain $S_{DD21}$ of 38 dB. Within 45 GHz, the input matching $S_{DD11}$ and output matching $S_{DD22}$ are less than −7 dB and −10 dB, respectively, demonstrating limiting amplifier capability at speeds of 35 Gb/s.

Conclusion

An embodiment of the invention provides a 35 Gb/s CMOS limiting amplifier using cascaded-distributed amplifiers together with Butterworth network, active feedback and on-chip transformers, achieving a differential gain of 38 dB and a passband bandwidth of 26.2 GHz. Unlike conventional amplifiers, high voltage, high power consumption, and large silicon area requirement are avoided with high operating data rate enabled.

Input stage 42 alone may be combined with gain stages, an output buffer and a feedback filter other than those disclosed in this specification. Similarly, gain stages 44 or output buffer 46 can also be combined with other components in limiting amplifiers other than that disclosed.

While the invention has been described by way of examples and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A limiting amplifier, comprising:
an input stage with dc offset cancellation, receiving a differential input signal and outputting a first intermediate differential signal;
gain stages, cascaded to amplify the first intermediate differential signal and generate a second intermediate differential signal;
an output buffer, amplifying the second intermediate differential signal to produce an output signal; and
a feedback filter providing a dc offset voltage of the output signal to the input stage for the dc offset cancellation;
wherein the input stage comprises a resistor network connected between a pair of input nodes and a power line, the resistor network comprises:
a common resistor connected to the power line;
a pair of load resistors sharing a common terminal connected to the common resistor; and
a shunt resistor with two terminals respectively connected to the load resistors,
wherein the input stage further comprises a pair of center-tapped inductors, each connected between a corresponding input node and a corresponding load resistor and providing a center tap for outputting the first intermediate differential signal.

2. The limiting amplifier of claim 1 wherein each of the center-tapped inductors is a center-tapped transformer.

3. The limiting amplifier of claim 2, wherein each center-tapped transformer has a symmetric geometry.

4. The limiting amplifier of claim 1 wherein the output buffer has a pair of output nodes to produce the output signal, the input stage comprising a differential pair sensing the dc offset voltage of the output signal.

* * * * *